US010347725B2

(12) United States Patent
Nobukuni et al.

(10) Patent No.: US 10,347,725 B2
(45) Date of Patent: Jul. 9, 2019

(54) SEMICONDUCTOR DEVICE THAT FACILITATES A REDUCTION IN THE OCCURRENCES OF CRACKING IN A SEMICONDUCTOR LAYER ACCOMPANYING THERMAL STRESS

(71) Applicant: Mitsubishi Electric Corporation, Tokyo (JP)

(72) Inventors: Akihiko Nobukuni, Tokyo (JP); Hirofumi Oki, Tokyo (JP); Yoshifumi Tomomatsu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/956,977

(22) Filed: Dec. 2, 2015

(65) Prior Publication Data
US 2016/0380068 A1    Dec. 29, 2016

(30) Foreign Application Priority Data

Jun. 23, 2015   (JP) ................................ 2015-125832

(51) Int. Cl.
*H01L 29/45*     (2006.01)
*H01L 29/417*    (2006.01)
(Continued)

(52) U.S. Cl.
CPC .... *H01L 29/41716* (2013.01); *H01L 29/0619* (2013.01); *H01L 29/0638* (2013.01);
(Continued)

(58) Field of Classification Search
CPC ............ H01L 24/03; H01L 29/45–458; H01L 29/7395–7398; H01L 29/1608;
(Continued)

(56) References Cited

U.S. PATENT DOCUMENTS 5,071,714 A * 12/1991 Rodbell .............. H01L 21/4846
                                                    204/192.17
5,144,401 A *  9/1992 Ogura ................. H01L 29/744
                                                    257/133
(Continued)

FOREIGN PATENT DOCUMENTS

JP       H11-087499 A     3/1999
JP       2000-232092 A    8/2000
(Continued)

OTHER PUBLICATIONS

An Office Action issued by the Japanese Patent Office dated Apr. 3, 2018, which corresponds to Japanese Patent Application No. 2015-125832 and is related to U.S. Appl. No. 14/956,977; with English translation.
(Continued)

*Primary Examiner* — Eric A. Ward
(74) *Attorney, Agent, or Firm* — Studebaker & Brackett PC

(57) ABSTRACT

An emitter electrode includes a first electrode layer, a second electrode layer, and a third electrode layer. The first to third electrode layers are laid in this order on an emitter layer. A solder layer is further laid on the third electrode layer. The first electrode layer covers the emitter layer and a gate oxide film in a front surface of a semiconductor chip. A first electroconductive material forming the first electrode layer has AlSi as its main component. A second electroconductive material forming the second electrode layer has a linear expansion coefficient different from that of the first electroconductive material and is lower in mechanical strength than the first electroconductive material. A third electroconductive material constituting the third electrode layer has a linear expansion coefficient different from that of the first
(Continued)

B-B CROSS SECTIONAL VIEW electroconductive material and has solder wettability higher than that of the first electrode layer.

17 Claims, 9 Drawing Sheets

(51) Int. Cl.
| | | |
|---|---|---|
| H01L 29/739 | (2006.01) | |
| H01L 29/74 | (2006.01) | |
| H01L 29/78 | (2006.01) | |
| H01L 29/06 | (2006.01) | |
| H01L 29/16 | (2006.01) | |
| H01L 29/20 | (2006.01) | |

(52) U.S. Cl.
CPC .... *H01L 29/41725* (2013.01); *H01L 29/7397* (2013.01); *H01L 29/74* (2013.01); *H01L 29/7802* (2013.01); *H01L 29/7811* (2013.01); *H01L 29/7813* (2013.01); *H01L 29/1608* (2013.01); *H01L 29/2003* (2013.01); *H01L 29/7395* (2013.01); *H01L 2224/40137* (2013.01); *H01L 2224/48091* (2013.01); *H01L 2224/73265* (2013.01); *H01L 2924/13055* (2013.01); *H01L 2924/181* (2013.01)

(58) Field of Classification Search
CPC ............. H01L 29/401; H01L 29/66068; H01L 29/7802; H01L 29/808; H01L 21/0455; H01L 21/0485
See application file for complete search history.

(56) References Cited

U.S. PATENT DOCUMENTS

| | | | | |
|---|---|---|---|---|
| 5,451,544 A * | 9/1995 | Gould | ............... | H01L 21/28518 148/DIG. 20 |
| 6,147,403 A * | 11/2000 | Matschitsch | ........ | H01L 23/4827 257/750 |
| 7,045,388 B2 * | 5/2006 | Tatsumi | ................... | H01L 24/05 228/180.22 |
| 7,271,477 B2 * | 9/2007 | Saito | ................. | H01L 23/49575 257/686 |
| 7,994,005 B2 * | 8/2011 | Herbert | ............... | H01L 29/7813 438/270 |
| 8,377,832 B2 * | 2/2013 | Takano | ............... | H01L 29/0619 257/636 |
| 9,607,961 B2 * | 3/2017 | Sato | ...................... | H01L 29/407 |
| 2004/0256730 A1 * | 12/2004 | Hirano | .................. | H01L 23/482 257/765 |
| 2011/0278666 A1 * | 11/2011 | Liu | ...................... | H01L 29/1095 257/334 |
| 2012/0007104 A1 | 1/2012 | Wada et al. | | |
| 2014/0015019 A1 * | 1/2014 | Okamoto | ................ | H01L 29/78 257/288 |
| 2014/0145341 A1 | 5/2014 | Tanaka | | |
| 2015/0069614 A1 * | 3/2015 | Nishikawa | ............ | H01L 29/456 257/766 |
| 2016/0056040 A1 * | 2/2016 | Tanaka | ................ | H01L 21/0485 438/602 |
| 2016/0148896 A1 * | 5/2016 | Minotti | ................... | H01L 24/05 257/762 |
| 2016/0163654 A1 * | 6/2016 | Nakanishi | ............. | H01L 23/552 257/140 |
| 2016/0254761 A1 * | 9/2016 | Furukawa | ............... | H01L 25/16 |

FOREIGN PATENT DOCUMENTS

| | | |
|---|---|---|
| JP | 2003-051500 A | 2/2003 |
| JP | 2003-523634 A | 8/2003 |
| JP | 2005-019447 A | 1/2005 |
| JP | 2007-005368 A | 1/2007 |
| JP | 2010-272766 A | 12/2010 |
| JP | 2010-278164 A | 12/2010 |
| JP | 2011-249491 A | 12/2011 |
| JP | 2014-099444 A | 5/2014 |
| JP | 2014-107489 A | 6/2014 |
| JP | 5549118 B2 | 7/2014 |
| JP | 2014-236043 A | 12/2014 |
| WO | 01/61762 A2 | 8/2001 |

OTHER PUBLICATIONS

An Office Action mailed by the Japanese Patent Office dated Oct. 9, 2018, which corresponds to Japanese Patent Application No. 2015-125832 and is related to U.S. Appl. No. 14/956,977.

An Office Action mailed by the State Intellectual Property Office of People's Republic of China dated Dec. 21, 2018, which corresponds to Chinese Patent Application No. 201610096571.9 and is related to U.S. Appl. No. 14/956,977.

An Office Action issued by the Chinese Patent Office dated May 21, 2019, which corresponds to Chinese Patent Application No. 201610096571.9 and is related to U.S. Appl. No. 14/956,977; with English language translation.

* cited by examiner

A-A CROSS SECTIONAL VIEW

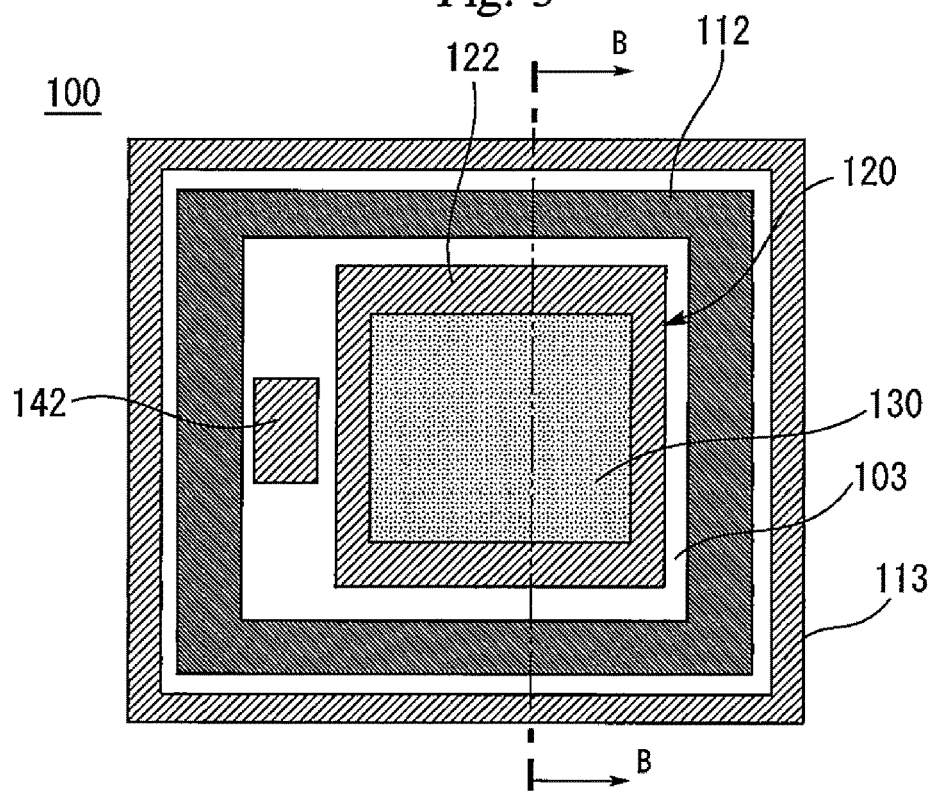
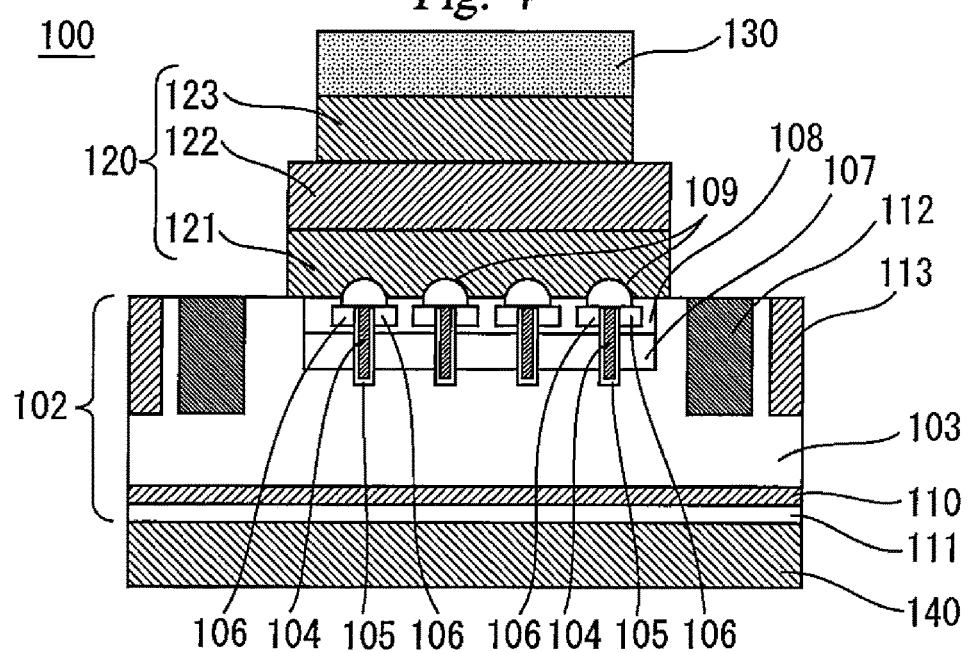
B-B CROSS SECTIONAL VIEW

B1-B1 CROSS SECTIONAL VIEW

C-C CROSS SECTIONAL VIEW

C1-C1 CROSS SECTIONAL VIEW

SEMICONDUCTOR DEVICE THAT FACILITATES A REDUCTION IN THE OCCURRENCES OF CRACKING IN A SEMICONDUCTOR LAYER ACCOMPANYING THERMAL STRESS

BACKGROUND

Technical Field

The present application relates to a semiconductor device.

Background Art

Power semiconductor devices such as IGBTs and power MOSFETs have been studied and developed, for example, as disclosed in Japanese Patent Laid-Open No. 2007-5368. The semiconductor device disclosed in this publication has an AlSi layer, an Ni layer and a solder layer laid one on another in this order on a semiconductor substrate formed, for example, of silicon. For provision of the semiconductor layer, an Ni layer having good solder wettability is required. An Al-based layer such as an AlSi layer is provided for performing Ni plating. The need for an Al-based layer is specifically mentioned, for example, in paragraph 0007 in this publication.

In a power semiconductor element with which electric power is handled, the amount of heat generation accompanying its operation is large and an electrode laid on a front surface of a semiconductor layer is thermally expanded by heat generation. When a stress is caused in the electrode and the stack structure of the semiconductor layer with a change in temperature, there is a risk of a crack being generated in the semiconductor layer surface or the electrode. Also in an electrode having a stack of layers of different metals having different linear expansion coefficients as in the above-mentioned related art, stress is also caused between the layers by thermal expansion. However, the above-mentioned publication lacks consideration of the problem of cracking accompanying such thermal stress. With conventional semiconductor devices, there have been problems to be solved from the viewpoint of thermal stress.

SUMMARY

In view of the above-described problems, an object of the present invention is to provide a semiconductor device in which the occurrence of cracking in a semiconductor layer accompanying thermal stress is reduced.

According to one aspect of the present invention, a semiconductor device includes: a semiconductor layer; a first electrode layer provided on a front surface of the semiconductor layer and formed of a first electroconductive material; a second electrode layer laid on the first electrode layer; and a third electrode layer laid on the second electrode layer. The second electrode layer is formed of a second electroconductive material having a linear expansion coefficient different from that of the first electroconductive material and lower in mechanical strength than the first electroconductive material. The third electrode layer is formed of a third electroconductive material having a linear expansion coefficient different from that of the first electroconductive material and having solder wettability higher than that of the first electroconductive material.

According to another aspect of the present invention, a semiconductor device includes: a semiconductor layer; a first electrode layer laid on a front surface of the semiconductor layer and formed of AlCu or AlSiCu; and a second electrode layer laid on the first electrode layer and formed of Cu.

Other and further objects, features and advantages of the invention will appear more fully from the following description.

BRIEF DESCRIPTION OF THE DRAWINGS

FIG. 3 is a schematic plan view of the semiconductor device according to the first embodiment of the present invention;

FIG. 4 is a schematic sectional view of the semiconductor device according to the first embodiment of the present invention;

DETAILED DESCRIPTION OF THE PREFERRED EMBODIMENTS

First Embodiment

Figure 1:
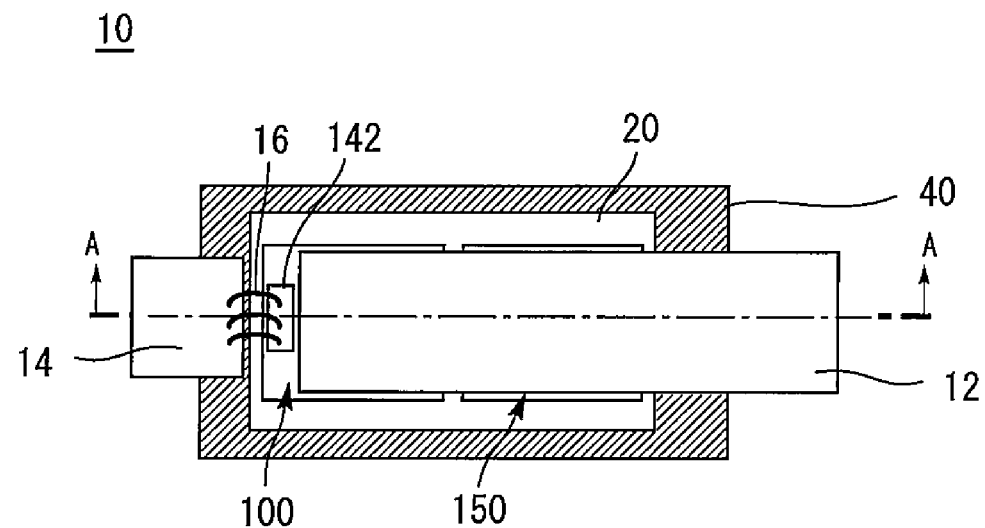
FIG. 1 is a schematic plan view showing a power semiconductor module according to a first embodiment of the present invention.
Figure 2:
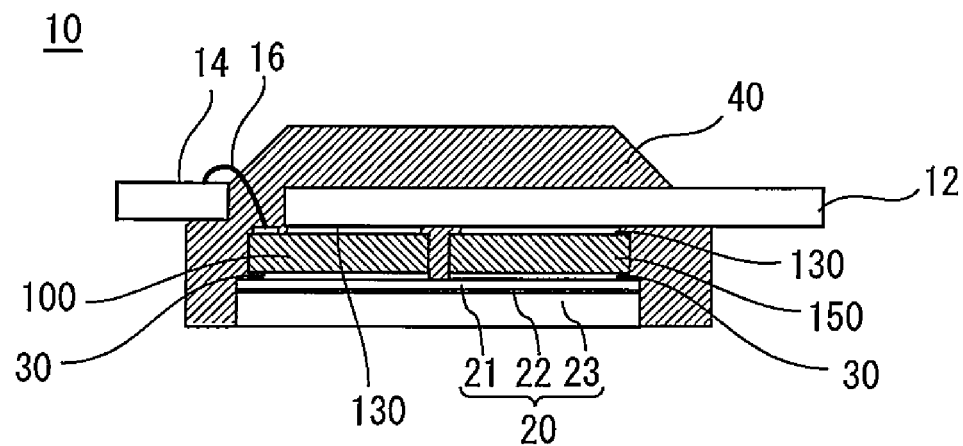
FIG. 2 is a schematic sectional view of the power semiconductor module according to the first embodiment of the present invention.

FIG. 1 is a schematic plan view showing a power semiconductor module 10 according to a first embodiment of the present invention. FIG. 1 illustrates an internal structure of the power semiconductor module 10 seen through a molding resin 40. FIG. 2 is a schematic sectional view of the power semiconductor module 10. FIG. 2 shows a section of the power semiconductor module 10 taken along line A-A in FIG. 1.

The power semiconductor module 10 includes a heat radiating plate 20, a semiconductor device 100 and a semiconductor device 150 provided on the heat radiating plate 20, a lead frame 12 soldered on the semiconductor device 100 and the semiconductor device 150, a lead frame 14 connected to a gate electrode pad 142 on the semiconductor device 100 by wires 16, and the molding resin 40 that covers these components while exposing end portions of the lead frames 12 and 14. In the first embodiment, the semiconductor device 100 is, for example, an insulated gate bipolar transistor (IGBT) while the semiconductor device 150 is, for example, a diode. The heat radiating plate 20 is formed, for example, by providing an insulating layer 22 and an electrode pattern 21 on a metal plate 23. The electrode pattern 21 is soldered to the semiconductor devices 100 and 150. A back surface (collector) of the semiconductor device 100 is connected to the electrode pattern 21, though this connection is not shown in FIGS. 1 and 2. Another lead frame connected to the electrode pattern 21 by wires or the like may be further provided. The structure of the power semiconductor module 10 schematically shown in FIGS. 1 and 2 is only an example. Modifications, for example, in terms of the numbers of semiconductor devices 100 and 150, electrical connections for the semiconductor devices 100 and 150 and the positions and the number of lead frames according to various well-known device forms can be made. The power semiconductor module 10 according to the first embodiment is of a transfer mold package structure covered with the molding resin 40. However, the present invention is not limited to this. The present invention may be a power semiconductor module having the semiconductor devices 100 and 150 housed in a resin case together with an insulated circuit substrate and including terminals protecting out of the case. Junctions between the semiconductor devices 100 and 150 and the lead frame 12 are made by means of a solder layer 130, while junctions between the semiconductor devices 100 and 150 and the heat radiating plate 20 are made by means of solder 30.

FIG. 3 is a schematic plan view of the semiconductor device 100 according to the first embodiment of the present invention. FIG. 4 is a schematic sectional view of the semiconductor device 100, and shows a section of the semiconductor device 100 taken along line B-B in FIG. 3. The semiconductor device 100 is an IGBT having a trench gate electrode 104. The semiconductor device 100 includes a semiconductor chip 102, a gate electrode pad 142 and an emitter electrode 120 provided on a surface of the semiconductor chip 102, and a collector electrode 140 provided on a back surface of the semiconductor chip 102. While the first embodiment is described by way of example with respect to a case where a semiconductor substrate material constituting the semiconductor chip 102 is silicon carbide (SiC), Si or a wide-bandgap semiconductor other than SiC may alternatively be used as described later.

The semiconductor chip 102 includes an $n^-$-type drift layer 103 formed of SiC, an $n^+$-type charge accumulation layer 107 laid above the drift layer 103, a p-type base layer 108 laid above the charge accumulation layer 107, trench gate electrodes 104 formed of polysilicon and reaching the drift layer 103 by extending through the p-type base layer 108 and the charge accumulation layer 107 with a gate insulating film 105 interposed between the trench gate electrode 104 and these layers, an $n^+$-type emitter layer 106 provided on opposite sides of each trench gate electrode 104 with the gate insulating film 105 interposed therebetween, and a gate oxide film 109 provided above each trench gate electrode 104. An emitter electrode 120 is provided so as to cover the gate oxide film 109 and the emitter layer 106. The semiconductor chip 102 also includes, as its portions on the back surface side, an $n^+$-type buffer layer 110 laid below the drift layer 103, and a $p^+$-type collector layer 111 provided below the buffer layer 110. The collector electrode 140 is provided on a back surface of the collector layer 111.

A guard ring 112 is provided outside a region in the semiconductor chip 102 where the trench gate electrode 104, the emitter layer 106 and other portions of the semiconductor chip 102 are formed (i.e., the cell region). A channel stopper 113 is further provided outside the guard ring 112. The channel stopper 113 and the guard ring 112 are not electrically connected with the emitter layer 106. The collector electrode 140 provided on the back surface of the semiconductor chip 102 covers almost the whole of the back surface of the semiconductor chip 102. The emitter electrode 120 is formed so as to be a size smaller than the collector electrode 140 as seen in the plan view of the semiconductor chip 102.

While the charge accumulation layer 107 is provided in one preferred mode according to the present embodiment, an IGBT not having the charge accumulation layer 107 may suffice.

The emitter electrode 120 includes a first electrode layer 121, a second electrode layer 122 and a third electrode layer 123. The first electrode layer 121, the second electrode layer 122 and the third electrode layer 123 are laid one on another on the emitter layer 106 in this order. The solder layer 130 is further laid on the third electrode layer 123. As shown in FIG. 2, the third electrode layer 123 is soldered to the lead frame 12 by means of the solder layer 130. The guard ring 112 is provided so as to surround the first electrode layer 121 as seen in the plan view of the semiconductor chip 102 shown in FIG. 3. Further, in a preferred mode according to the first embodiment, the second electrode layer 122 is provided by being extended outward relative to the third electrode layer 123 so that a peripheral edge of the second electrode layer 122 surrounds a peripheral edge of the third electrode layer 123 as seen in the plan view of the semiconductor chip 102. The first electrode layer 121 and the second electrode layer 122 are formed inside the guard ring 112 and the third electrode layer 123 and the solder layer 130 are formed so as to be a size smaller than the second electrode layer 122.

Referring to the sectional view of the emitter electrode 120 shown in FIG. 4, the thicknesses of the electrode layers and other factors do not restrict the actual layer thickness magnitude relationship and size ratios. The same is to be also said with respect to sectional views of other semiconductor devices described below.

The first electrode layer 121 covers the emitter layer 106 and the gate oxide film 109 in the surface of the semiconductor chip 102. The first electrode layer 121 is formed of a first electroconductive material having a linear expansion coefficient different from that of the semiconductor constituting the semiconductor chip 102. In the first embodiment, the first electroconductive material forming the first electrode layer 121 has AlSi as its main component. The second electrode layer 122 is laid on the first electrode layer 121 and is formed of a second electroconductive material. The second electroconductive material has a linear expansion coefficient different from that of the first electroconductive material and is lower in mechanical strength than the first electroconductive material. The third electrode layer 123 is laid on the second electrode layer 122 and is formed of a third electroconductive material. The third electroconductive material has a linear expansion coefficient different from that of the first electroconductive material and is higher in solder wettability than the material of the first electrode layer 121. A typical example of a metal having high solder wettability is Ni. In the first embodiment, the third electroconductive material is assumed to be a layer of a material having Ni as its main component, i.e., a layer of pure Ni or a Ni alloy.

The mechanical strength of the first electroconductive material constituting the first electrode layer 121 is referred to as "strength St1" for convenience sake; the mechanical strength of the second electroconductive material constituting the second electrode layer 122, as "strength St2"; the mechanical strength of the third electroconductive material constituting the third electrode layer 123, as "strength St3"; and the mechanical strength of the solder material constituting the solder layer 130, as "strength St4". In the first embodiment, a selection of electroconductive materials for the layers is made such that a relationship: St1>St2 is established. A selection of materials may alternatively be made such that at least a relationship: St1>St2>St3 is established. Also, a selection of materials may alternatively be made such that a relationship: St1>St3>St2 is established. Further, the mechanical strengths of the layers may be set so that a relationship: St1, St3, St4>St2 is established, that is, the strength St2 is the smallest of the strengths St1 to St4. The provision of the second electrode layer 122 lower in mechanical strength ensures that in the event of occurrence of a thermal shock, the thermal shock is concentrated in the second electrode layer 122. The second electrode layer 122 bears the shock. Therefore, even when a crack occurs, it can be stopped by the second electrode layer 122. Thus, the growth of a crack into the IGBT cell region in the layers below the first electrode layer 121 can be prevented. Also, the first electrode layer 121 can be protected from cracking.

Description will be made of "mechanical strength". In comparison between different two materials, basically one of the materials higher in tensile strength (N/mm$^2$) is considered to be higher in mechanical strength. In a case where two materials are equivalent in tensile strength but differ in another numeric value (proof stress or hardness), hardness or proof stress (N/mm$^2$) may then be used as an index. There are various hardness tests, for example, for Brinell hardness, Vickers hardness, Rockwell hardness and Shore hardness. In any case, values measured by the same test may be compared to determine the magnitude relationship. Proof stresses of materials may be determined by comparing, for example, numeric values representing 0.2% proof stresses of the materials. In a case where a plurality of materials are equivalent in tensile strength, one of the materials having a hardness higher than that of another of the materials is considered to be higher in mechanical strength. Further, in a case where a plurality of materials are equivalent in tensile strength and in hardness, one of the materials having a proof stress higher than that of another of the materials is considered to be higher in mechanical strength. Thus, a magnitude relationship in terms of mechanical strength can be determined in priority order: tensile strength>hardness>proof stress. Typical numeric values of mechanical strengths of metallic materials measured in bulk have been made public. Comparison between mechanical strengths of materials may be made by referring to the bulk strength values made public.

A further concrete description will be made on the basis of the above-described magnitude relationship in terms of "mechanical strength". The first electroconductive material may be AlSi. When the first electroconductive material is AlSi, the second electroconductive material may be pure aluminum or an aluminum alloy lower in mechanical strength than the first electroconductive material. Further, the first electroconductive material may be AlSi having a proportion of Si higher than 1%. That is, the material of the first electrode layer 121 is AlSi in which the proportion of Si added to Al is higher than 1%. As a result, breakdown of the device due to a crack caused by a thermal shock can be prevented and an effect of improving the reliability by increasing the proof stress of the first electrode layer 121 is obtained. AlSi in which the proportion of Si is in a specific numeric value range of, for example, 1 to 2% may be used. A modification may be made such that the first electroconductive material is AlSiCu in which the proportion of Si is higher than 1%, and which contains Cu. When the first electroconductive material is AlSiCu, the second electroconductive material may be pure aluminum or an aluminum alloy. AlSiCu in which the proportion of Si is in a specific numeric value range of, for example, 1 to 2% may be used. As a result, breakdown of the device due to a crack caused by a thermal shock can be prevented and an effect of improving the reliability by increasing the proof stress of the first electrode layer 121 is obtained. As pure aluminum to be used as the second electroconductive material, any of various materials having an Al content of 99% or higher may be used and high-purity aluminum having an Al content of 99.9% or higher may be used. Another modification may be made in which each of the first electroconductive material and the second electroconductive material is AlSi and each of the first electrode layer 121 and the second electrode layer 122 is constructed by stacking a plurality of AlSi layers. In such a case, the mechanical strength of the second electrode layer 122 can be reduced in comparison with that of the first electrode layer 121 by setting the proportion of Si in the second electroconductive material lower that in the first electroconductive material.

The semiconductor device 100 capable of preventing breakdown of the device when a thermal shock occurs and having an extended lifetime and improved reliability can be provided. Even if the power semiconductor module 10 is used under a thermally severer condition, e.g., a high-temperature operating condition, improved reliability of the module can be ensured thanks to the incorporation of the semiconductor device 100.

Figure 5:
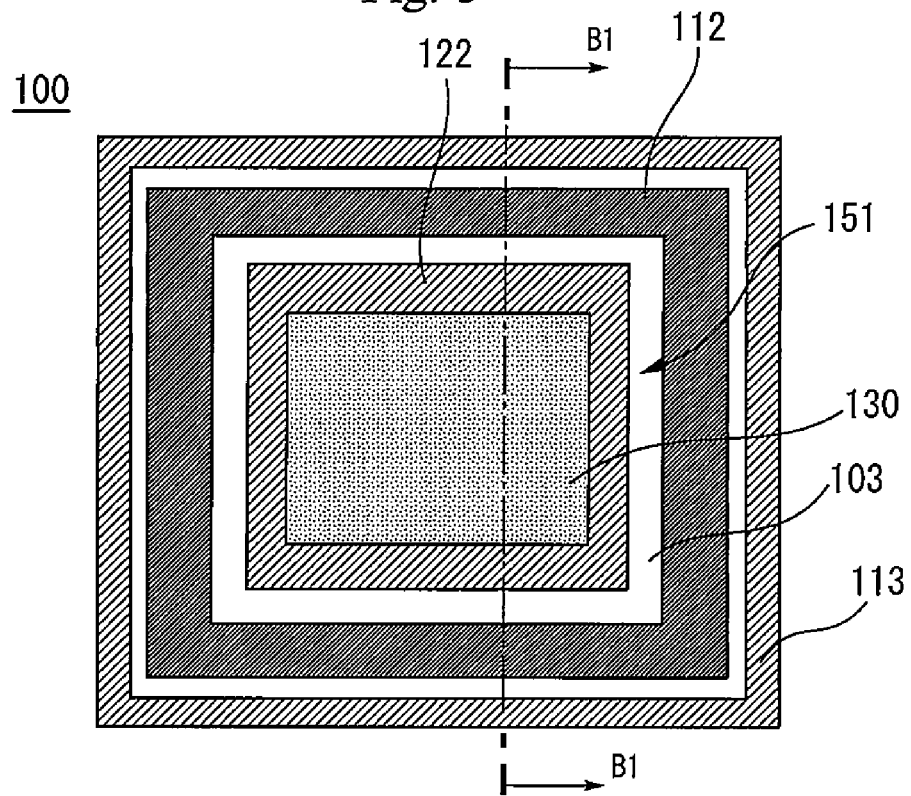
FIG. 5 is a schematic plan view of the other semiconductor device according to the first embodiment of the present invention.
Figure 6:
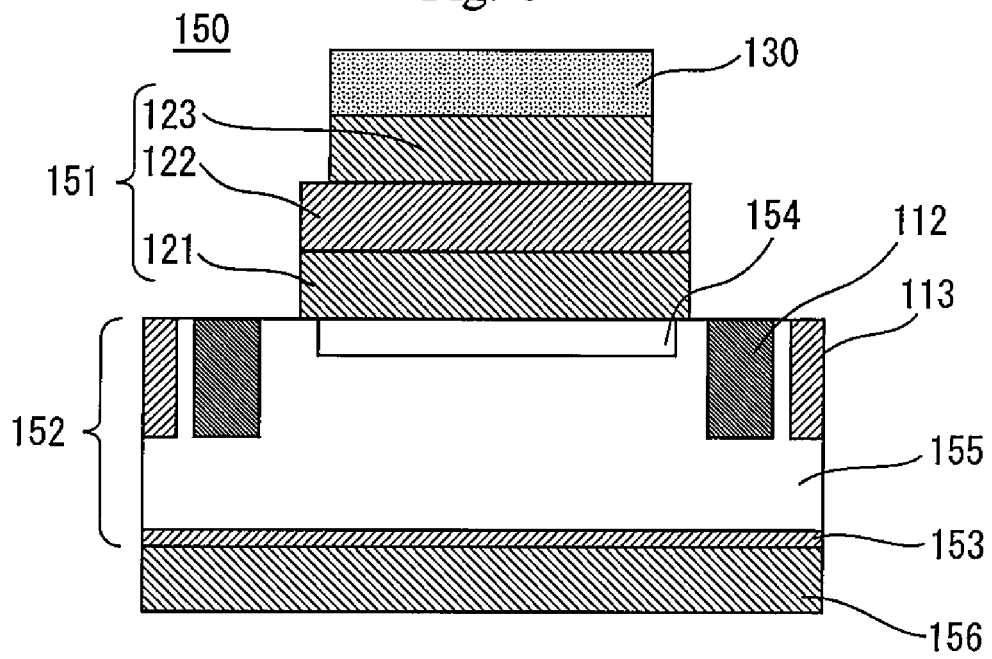
FIG. 6 is a schematic sectional view of the other semiconductor device according to the first embodiment of the present invention.

FIG. 5 is a schematic plan view of the other semiconductor device 150 according to the first embodiment of the present invention. FIG. 6 is a schematic sectional view of the semiconductor device 150. The semiconductor device 150 is a diode comprising a semiconductor chip 152 of a construction different from that in the semiconductor device 100 shown in FIGS. 3 and 4. The semiconductor device 150 includes the semiconductor chip 152, a cathode electrode 156 and an anode electrode 151. The anode electrode 151 has the same shape and multilayer structure as those of the emitter electrode 120, and the cathode electrode 156 has the same shape and material as those of the collector electrode 140. The semiconductor chip 152 includes a drift layer 155 formed of an n$^-$-type SiC, an anode layer 154 which is a p$^+$ layer provided in a surface of the drift layer 155, and a cathode layer 153 which is an n$^+$ layer provided on a back surface of the drift layer 155. A guard ring 112 and a channel stopper 113 are provided around the anode layer 154, as are those in the semiconductor device 100. The anode electrode 151 is laid on the anode layer 154. The anode electrode 151 has a first electrode layer 121, a second electrode layer 122 and a third electrode layer 123 laid one on another in this order, as does the emitter electrode 120. The anode electrode 151 is assigned the reference numeral different from that for the emitter electrode 120 for distinction from the same.

Figure 7:
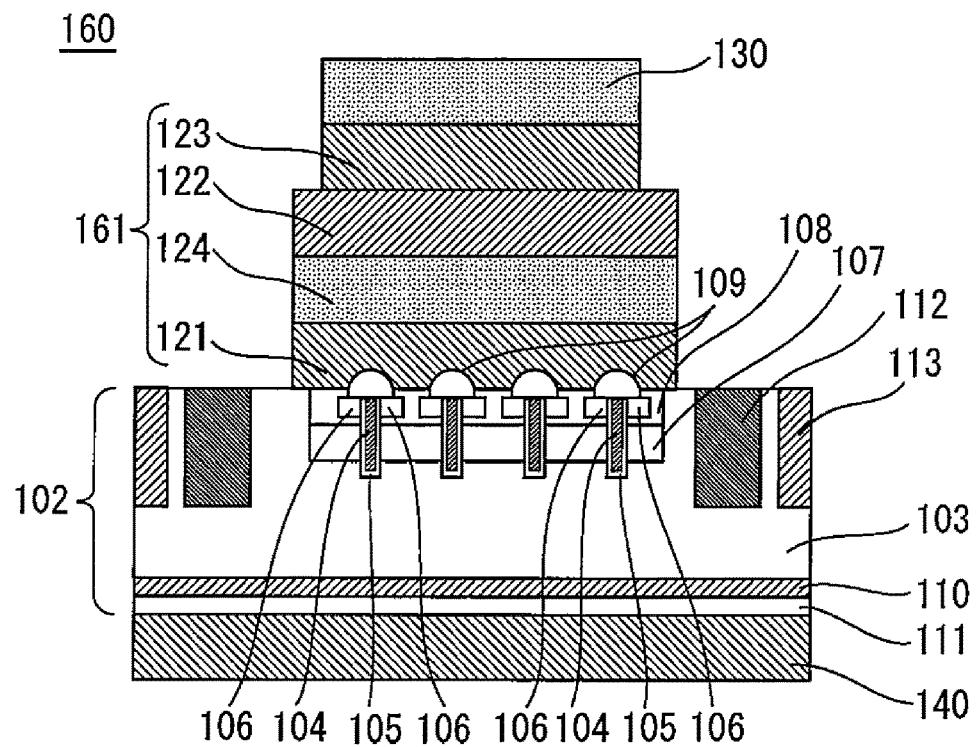
FIG. 7 is a schematic sectional view of a semiconductor device according to a modified example of the first embodiment of the present invention.

FIG. 7 is a schematic sectional view of a semiconductor device 160 according to a modified example of the first embodiment of the present invention. The semiconductor device 160 has the same construction as the semiconductor device 100 except that the emitter electrode 120 is replaced with an emitter electrode 161. The emitter electrode 161 has a barrier metal layer 124 inserted in the emitter electrode 120. The barrier metal layer 124 is inserted between the first electrode layer 121 and the second electrode layer 122 and is formed of an electroconductive material at least higher in mechanical strength than the second electroconductive material. More specifically, the material of the barrier metal layer 124 is titanium (Ti) or a Ti alloy. A material having a high mechanical strength is used for the barrier metal layer 124 in order to prevent a crack generated in the second electrode layer 122 from growing into the first electrode layer 121. Thus, with functioning of the barrier metal layer 124 as a barrier metal, a crack generated in the second electrode layer 122 is prevented from growing into the first electrode layer 121 and the IGBT cell region below the first electrode layer 121.

Figure 8:
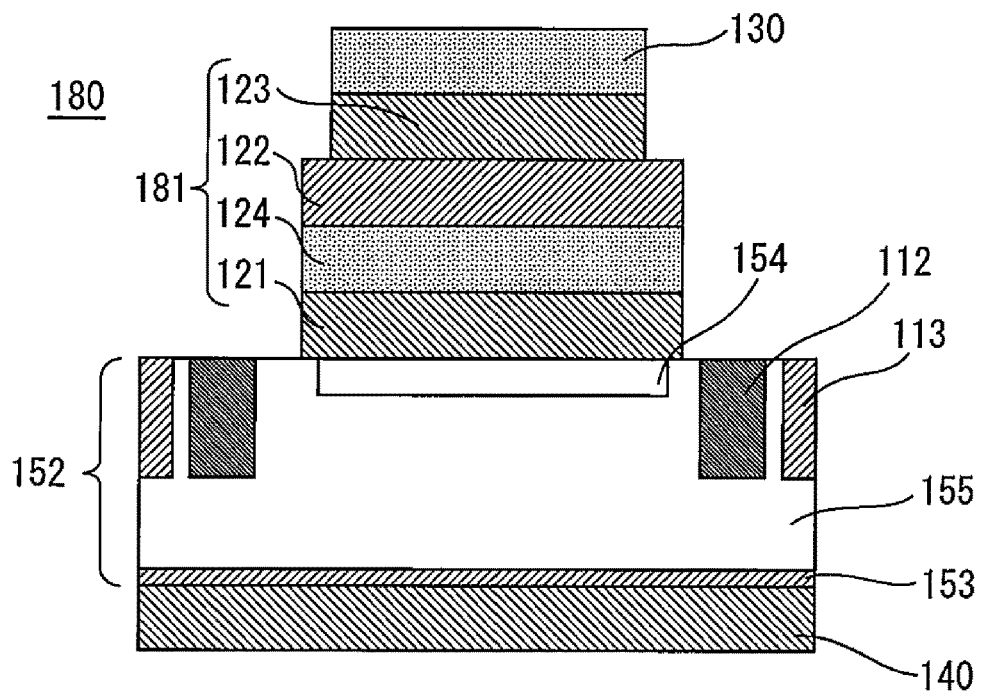
FIG. 8 is a schematic sectional view of a semiconductor device according to another modified example of the first embodiment of the present invention.

FIG. 8 is a schematic sectional view of a semiconductor device 180 according to another modified example of the first embodiment of the present invention. The semiconductor device 180 has the same construction as the semiconductor device 150 except that the anode electrode 151 is replaced with an anode electrode 181. The anode electrode 181 has a barrier metal layer 124 inserted between the first electrode layer 121 and the second electrode layer 122 in the anode electrode 151.

An example of a method of manufacturing the semiconductor device 100 and the power semiconductor module 10 will be described. In this example, the electrodes are formed by using sputtering. First, the semiconductor chip 102 formed by processing including well layer forming by impurity implantation, trench forming, and trench gate forming by embedding gate insulating film and polysilicon is prepared. The semiconductor chip 102 is placed in a chamber of a sputtering apparatus and the emitter electrode 120 is formed by sputtering using desired film forming metal materials as targets. For example, a target formed of AlSi is used for film forming of the first electrode layer 121; a target formed of pure aluminum, for film forming of the second electrode layer 122; and a target formed of Ni, for film forming of the third electrode layer 123. These targets may be prepared and used by being interchanged. If the material and composition of each electrode layer are changed, the targets may be changed. Also, in a method of manufacturing the semiconductor device 150, the semiconductor chip 152 is prepared and the anode electrode 151 may be formed by sputtering. In the case of the modified examples shown in FIGS. 7 and 8, a Ti target for example, is further prepared for the barrier metal layer 124 and sputtering may be performed by using this target between the step of forming the first electrode layer 121 and the step of forming the second electrode layer 122. Manufacturing methods for the gate electrode pad 142, the collector electrode 140 and the cathode electrode 156 are not particularly specified. However, each of these electrodes may also be formed by sputtering. After the electrodes are formed, the semiconductor devices 100 and 150 are mounted on the heat radiating plate 20 by means of solder 30 and the junctions between the semiconductor devices 100 and 150 and the lead frame 12 are made by means of the solder layer 130. The gate electrode pad 142 on the semiconductor device 100 and the lead frame 14 are connected by wires 16, and the devices are covered with the molding resin 40.

In the first embodiment, the area wetted with solder is restricted by forming the third electrode layer 123 so that the third electrode layer 123 is a size smaller than the second electrode layer 122 in order to avoid shorting between the guard ring 112 and the emitter electrode 120 as a result of spreading of solder in a wetting manner. When the lead frame 12 is joined by solder, stress can concentrate more easily in the emitter electrode 120 on the front surface side than in the collector electrode 140 on the back surface side. Therefore, cracking due to a thermal shock tends to be more considerable in the front electrode than in the back electrode. In this respect, however, the second electrode layer 122 is provided to cope with cracking in the first embodiment.

Second Embodiment

A power semiconductor module according to a second embodiment of the present invention has the same shape and structure as the power semiconductor module 10 according to the first embodiment except that the semiconductor devices 100 and 150 are respectively replaced with semiconductor devices 200 and 250. In the following description, therefore, components identical or corresponding to those in the first embodiment are described while being assigned the same reference numerals. Also, the description will be made mainly of points of difference from the first embodiment, and the description of common matters is simplified or omitted.

Figure 9:
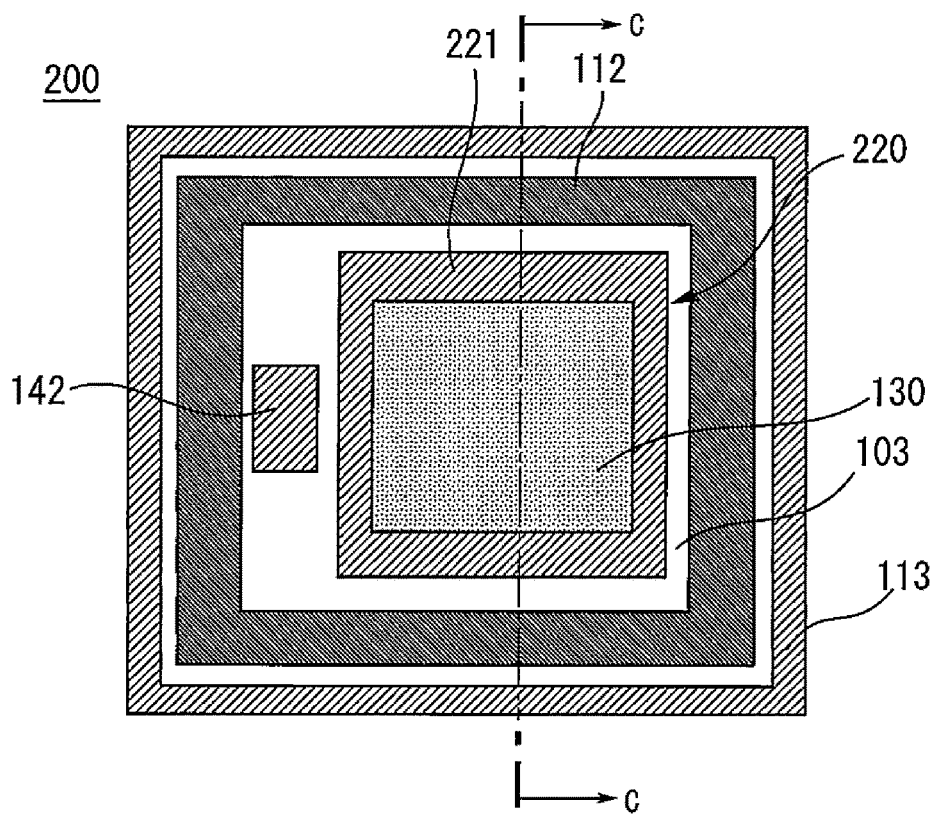
FIG. 9 is a schematic plan view of a semiconductor device according to the second embodiment of the present invention.
Figure 10:
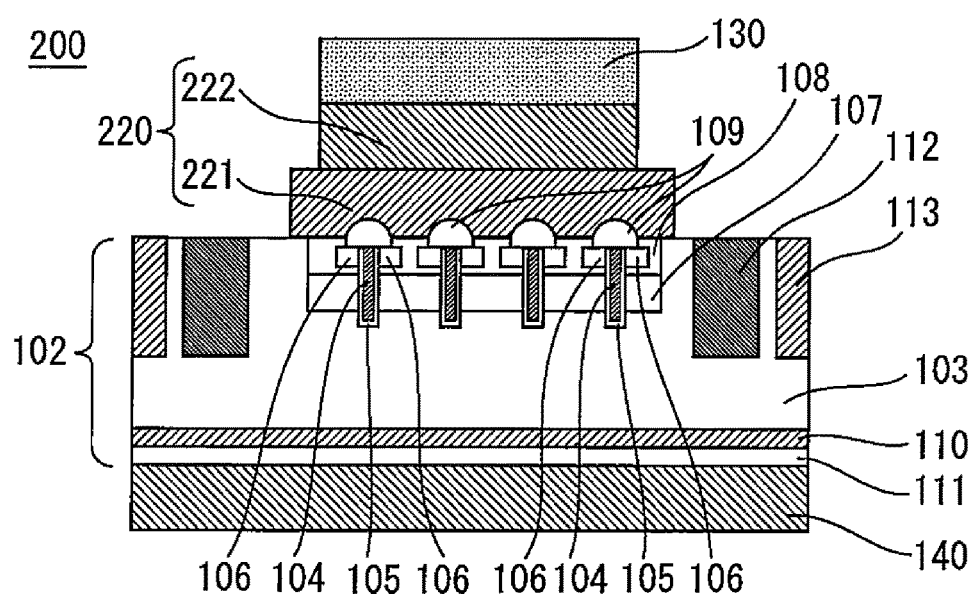
FIG. 10 is a schematic sectional view of the semiconductor device according to the second embodiment of the present invention.

FIG. 9 is a schematic plan view of a semiconductor device 200 according to the second embodiment of the present invention. FIG. 10 is a schematic sectional view of the semiconductor device 200. FIG. 10 shows a section of the semiconductor device 200 taken along line C-C in FIG. 9. The semiconductor device 200 according to the second embodiment has the same construction as the semiconductor device 100 according to the first embodiment except that the emitter electrode 120 is replaced with an emitter electrode 220. In the following description, therefore, components identical or corresponding to those in the first embodiment are described while being assigned the same reference numerals. Also, the description will be made mainly of points of difference from the first embodiment, and the description of common matters is simplified or omitted.

In the first embodiment, the emitter electrode 120 has the three-layer structure including the first to third electrode layers 121 to 123, and the AlSi, pure Al and Ni are used as the materials of these layers as described above. In a case where a number of layers differing in linear expansion coefficient from each other are stacked, stress is caused due to the differences in thermal expansion coefficient between the materials and a crack can occur easily. In the semiconductor device 200 according to the second embodiment, therefore, the emitter electrode 220 having not a three-layer structure but a two-layer structure is provided. The emitter electrode 220 has a stack of a first electrode layer 221 formed of AlCu and a second electrode layer 222 formed of Cu. Cu capable of being soldered is used for the second electrode layer 222 on which the solder layer 130 is to be laid. The second electrode layer 222 is formed so as to be a size smaller than the other electrode layers provided below the second electrode layer 222, as is the third electrode layer 123 in the first embodiment. Therefore, a peripheral portion of the first electrode layer 221 protrudes largely beyond the edge of the solder layer 130, as shown in FIG. 9.

The mechanical strength of an electroconductive material constituting the first electrode layer 221 is referred to as strength St21; the mechanical strength of an electroconductive material constituting the second electrode layer 222, as strength St22; and the mechanical strength of a material constituting the solder layer 130, as strength St4. In this case, the composition of AlCu constituting the first electrode layer 221 is adjusted so that at least St21>St22 is satisfied. The mechanical strength of solder is ordinarily lower than that of Cu or the like. In many cases, therefore, a relationship: St21>St22>St4 is established. As a manufacturing method according to the second embodiment, sputtering may be performed by using AlCu and Cu as targets, as is that in the first embodiment. Therefore, the description of the manufacturing method is omitted.

The material of the first electrode layer 221 may be AlCu in which the proportion of Cu is higher than 1%, and the proportion of Cu may be set in a range of, for example, 1 to 2%. The material of the first electrode layer 221 may be AlSiCu as an alternative to AlCu. More specifically, the material of the first electrode layer 221 may be AlSiCu in which the proportion of Si is higher than 1%. Further, the proportion of Si may be set in a range of for example, 1 to 2%.

Figure 11:
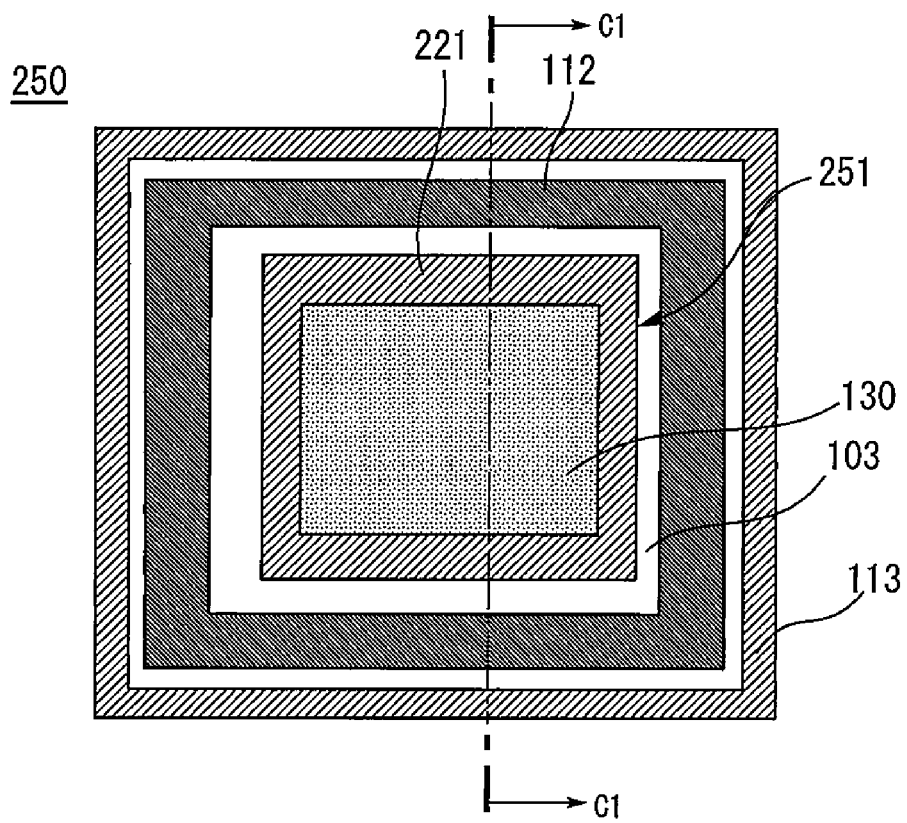
FIG. 11 is a schematic plan view of a semiconductor device according to a modified example of the second embodiment of the present invention.
Figure 12:
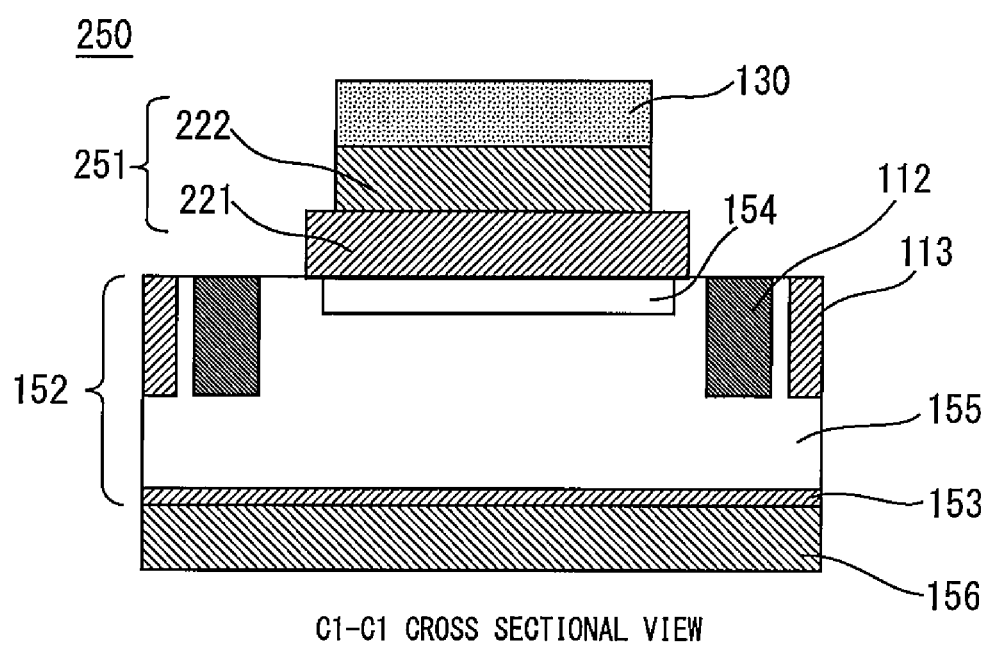
FIG. 12 is a schematic sectional view of the other semiconductor device according to a modified example of the second embodiment of the present invention.

FIG. 11 is a schematic plan view of a semiconductor device 250 according to a modified example of the second embodiment of the present invention. FIG. 12 is a schematic sectional view of the semiconductor device 250. The semiconductor device 250 is a diode having an anode electrode 251 provided in place of the anode electrode 151 in the semiconductor device 150 according to the first embodiment. The anode electrode 251 has a structure having a stack of a first electrode layer 221 and a second electrode layer 222, as does the emitter electrode 220 described above.

Figure 13:
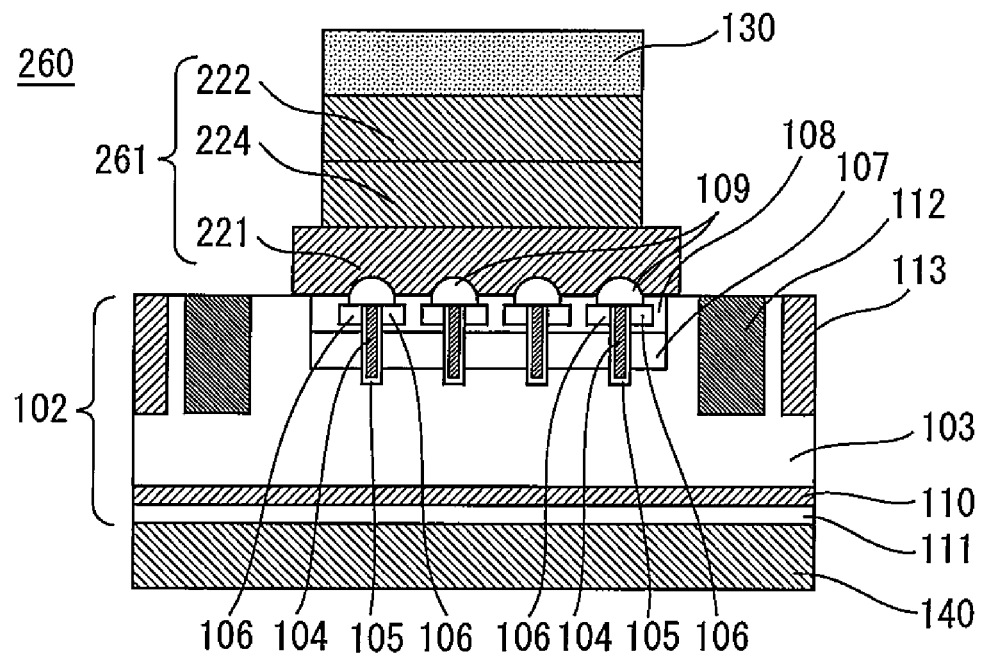
FIG. 13 is a schematic sectional view of a semiconductor device according to another modified example of the second embodiment of the present invention.

In a modified example of the emitter electrode 220 and the anode electrode 251 in the second embodiment described above, a barrier metal layer 224 formed of a material higher in mechanical strength than the material of the second electrode layer 222 may be provided between the first electrode layer 221 and the second electrode layer 222. The material of the barrier metal layer 224 may be tantalum (Ta) or a Ta alloy. FIG. 13 is a schematic sectional view of a semiconductor device 260 according to another modified example of the embodiment of the present invention. The semiconductor device 260 has the same construction as the above-described semiconductor device 200 except that an emitter electrode 261 in which a barrier metal layer 224 is inserted is provided.

In a still another modified example, each of the emitter electrode 220 and the anode electrode 251 in the second embodiment may include "another electrode layer" between the first electrode layer 221 and the second electrode layer 222, which another electrode layer is not illustrated. As a material for the other electrode layer, a material having a linear expansion coefficient different from that of the material of the first electrode layer 221 and lower in mechanical strength than the material of the first electrode layer 221 is used. The first electrode layer 221 and the other electrode layer may be formed of AlCu or AlSiCu with the same composition. In this case, the proportion of Cu contained in the material of the other electrode layer may be lower than that in the first electrode layer 221. The mechanical strength of the other electrode layer, which is represented by St23, may be set in this way so that a relationship: St21>St23 is established. The mechanical strength of the other electrode layer may alternatively be set so that a relationship: St21>St22>St23 is established.

In the above descriptions of the first and second embodiments, the IGBTs having the trench gate electrode 104 and the diodes are described as examples of implementation of the semiconductor device according to the present invention. However, the present invention can also be applied to semiconductor devices other than those described above.

Figure 14:
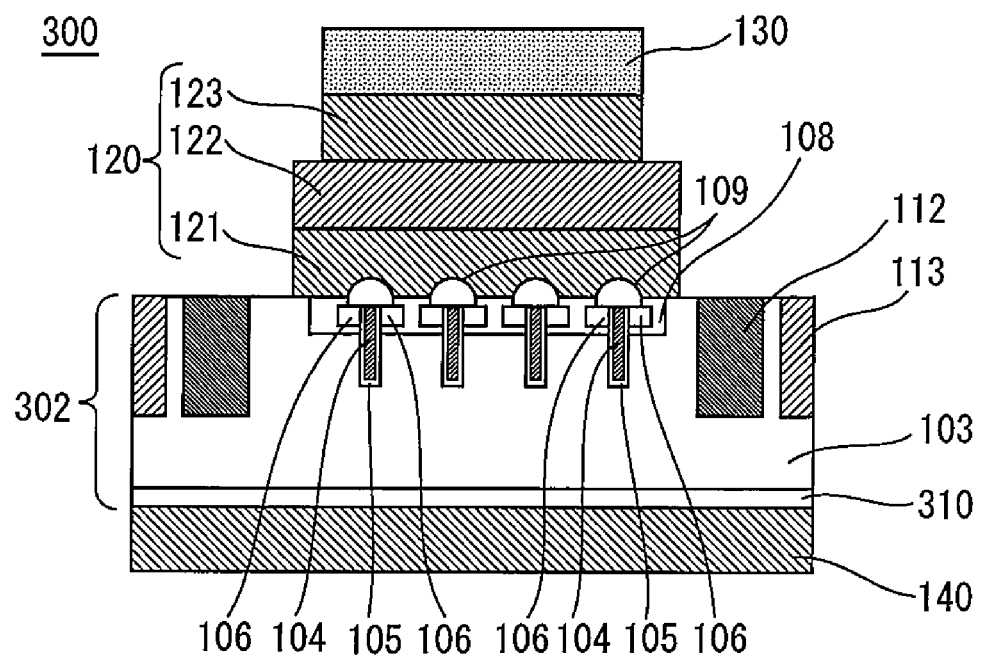
FIG. 14 is a schematic sectional view of a semiconductor device according to a further modified example of the embodiment of the present invention.

FIG. 14 is a schematic sectional view of a semiconductor device 300 according to a further modified example of the embodiment of the present invention. The semiconductor device 300 is a metal-oxide-semiconductor field-effect transistor (MOSFET). The structure of the semiconductor device 300 as viewed in plan is the same as that according to the first embodiment shown in FIG. 3 for example. Illustration of the structure in a plan view is therefore omitted. The difference between the semiconductor device 300 and the semiconductor device 100 resides in a device structure formed in a semiconductor chip 302 and the device structure formed in the semiconductor chip 102. The semiconductor chip 302 has basically the same construction as the semiconductor chip 102 except that the collector layer 111 and the charge accumulation layer 107 are not included, and that a drain layer 310 is included in place of the buffer layer 110. After ordinary association between the elements of an IGBT and elements of a MOSFET, the emitter layer 106, the emitter electrode 120 and the collector electrode 140 in the IGBT are differently read as "source layer 106", "source electrode 120" and "drain electrode 140" in the MOSFET. A film other than oxide film may be used as gate insulating film 105. In a case where this modification is made, the semiconductor device 300 is called a MISFET. Further, each of modifications described in the descriptions of the first and second embodiments can also be applied.

Figure 15:
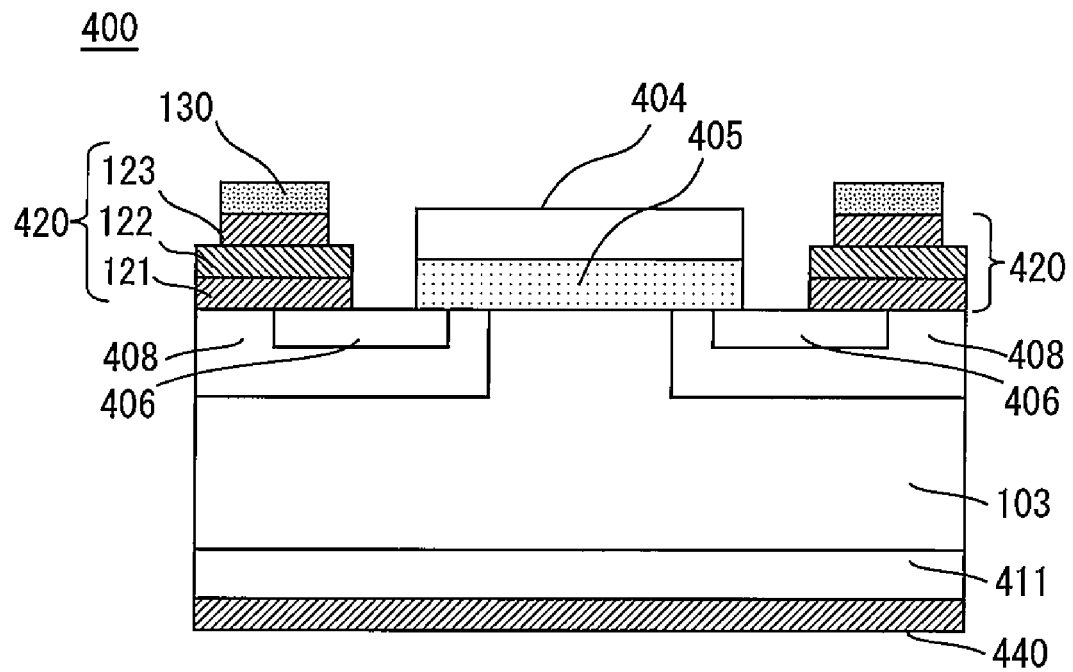
FIG. 15 is a schematic sectional view of a semiconductor device according to a further modified example of the embodiment of the present invention.
Figure 16:
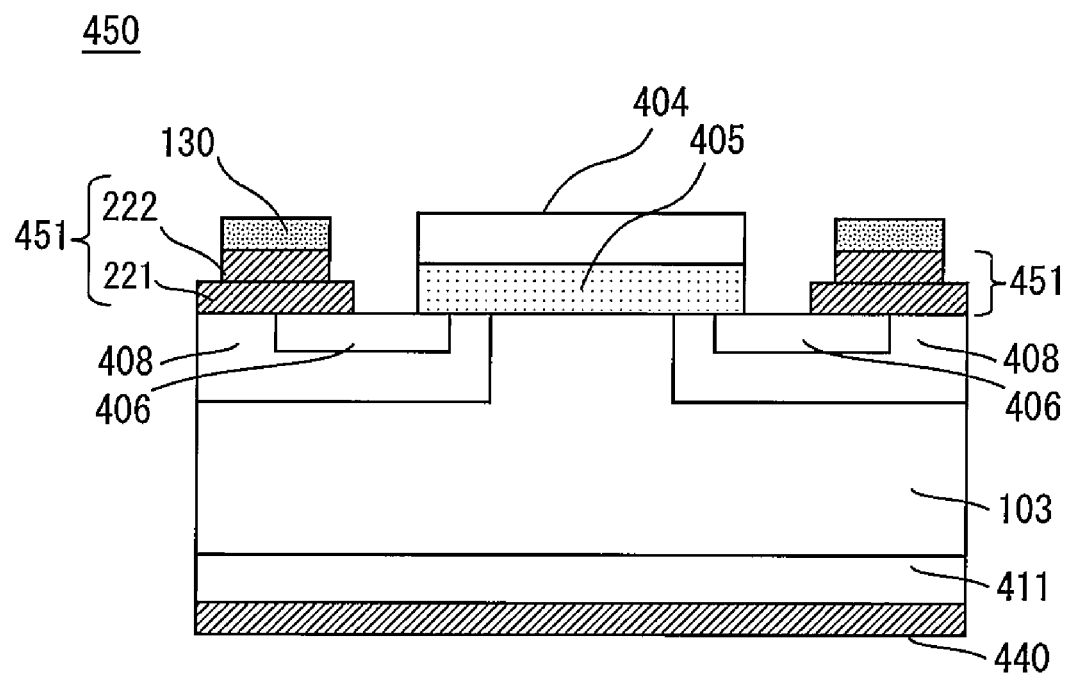
FIG. 16 is a schematic sectional view of a semiconductor device according to a further modified example of the embodiment of the present invention.

FIG. 15 is a schematic sectional view of a semiconductor device 400 according to still a further modified example of the embodiment of the present invention. The semiconductor device 400 is a MOSFET having not a trench gate but a planar gate. The planar gate is formed of a gate insulating film 405 and a gate electrode 404. The semiconductor device 400 includes an n-type drift layer 103, an $n^+$-type drain layer 411, and a drain electrode 440. As shown in FIG. 15, the semiconductor device 400 includes a plurality of $n^+$-type source layers 406, a plurality of p-type body layers 408, and a plurality of source electrodes 420. These elements are provided on opposite sides of the planar gate. Each source electrode 420 includes first to third electrode layers 121 to 123, as does, for example, the emitter electrode 120 in the first embodiment. The structure of the semiconductor device as viewed in plan may be thought to be the same as that according to the first embodiment shown in FIG. 3 for example. Illustration of the structure in a plan view is therefore omitted. FIG. 16 is a schematic sectional view of a semiconductor device 450 according to still a further modified example of the embodiment of the present invention. The semiconductor device 450 has a source electrode 451 provided in place of the source electrode 420 in the semiconductor device 400. The source electrode 451 has the same structure as the emitter electrode 220 according to the second embodiment. A conversion into a MISFET may be made by using as gate insulating film 105 an insulating film other than oxide film. A conversion into an IGBT can also be made by adding the collector layer 111 between the drain electrode 440 and the drain layer 411 in the semiconductor device 400. Further, each of the various modifications described in the descriptions of the first and second embodiments can also be applied to the source electrodes 420 and 451.

Figure 17:
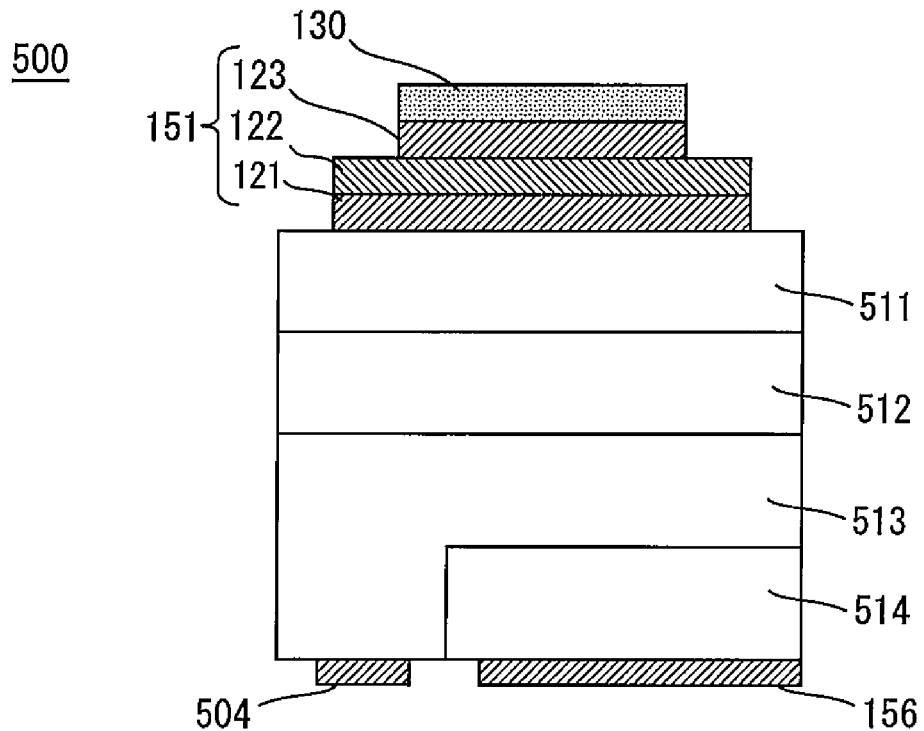
FIG. 17 is a schematic sectional view of a semiconductor device according to a further modified example of the embodiment of the present invention.
Figure 18:
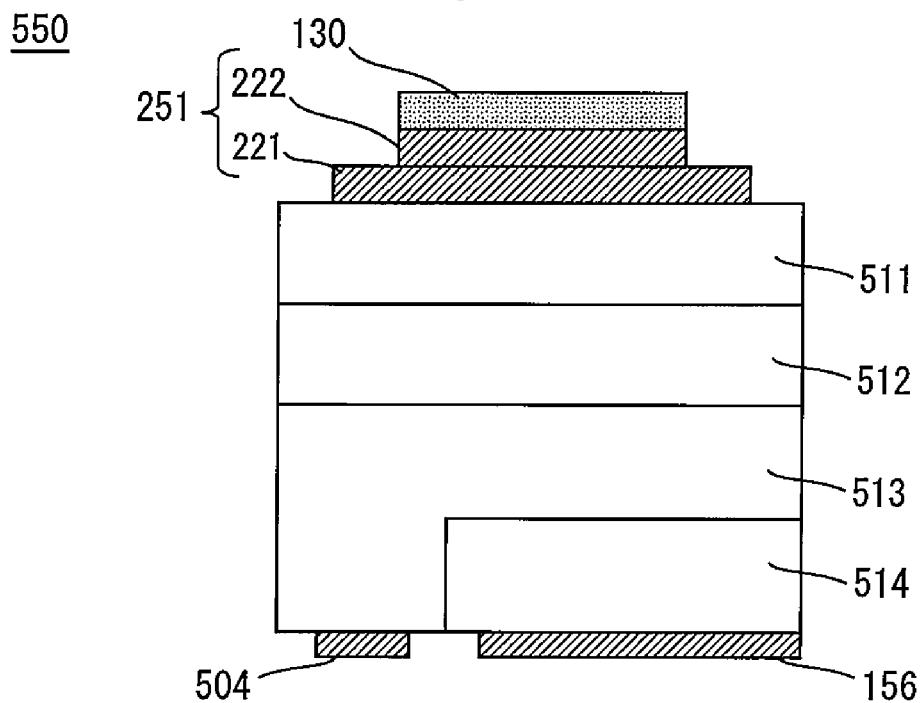
FIG. 18 is a schematic sectional view of a semiconductor device according to a further modified example of the embodiment of the present invention.

FIG. 17 is a schematic sectional view of a semiconductor device 500 according to still a further modified example of the embodiment of the present invention. The semiconductor device 500 is a thyristor. The semiconductor device 500 includes a p-type semiconductor layer 511 formed SiC for example, an n-type semiconductor layer 512, a p-type semiconductor layer 513 and an n-type semiconductor layer 514. An anode electrode 151 and a cathode electrode 156 are respectively provided on a front surface and a back surface of the stack of these semiconductor layers. Further, a gate electrode 504 is connected to the p-type semiconductor layer 513. The anode electrode 151 has the same structure as the anode electrode 151 in the first embodiment. As a modified example of the semiconductor device 500 shown in FIG. 16, a semiconductor device 550 shown in FIG. 18 may be provided by replacing the anode electrode 151 with the anode electrode 251 according to the second embodiment. Further, each of the various modifications described in the descriptions of the first and second embodiments can also be applied to the anode electrodes 151 and 251.

In recent years, semiconductors having a bandgap larger than that of silicon (Si) (wide-bandgap semiconductors) have found applications to semiconductor devices. In the first and second embodiments and the above-described modified examples, the semiconductor material is assumed to be SiC, which is one of wide-bandgap semiconductors. However, the present invention is not limited to this. A wide-bandgap semiconductor other than SiC may suffice. More specifically, a gallium nitride-based material (GaN) or diamond may suffice. A wide-bandgap semiconductor device is capable of operating at high temperature in comparison with Si semiconductor devices. There is, therefore, a strong possibility of a wide-bandgap semiconductor device being used under a severer high-temperature condition. Since the need for measures to cope with cracking due to a thermal shock in a wide-bandgap semiconductor device is stronger than that in the case of Si semiconductor devices as described above, the anti-cracking measures according to the embodiments described above are further effective in the case of using a wide-bandgap semiconductor device. Needless to say, Si can be used as a semiconductor material in place of a wide-bandgap semiconductor.

In the semiconductor devices 100 to 500 according to the above-described embodiments and the modified examples of the embodiments, the conduction type opposite to that described above by way of example can also be adopted for each layer. Also, the same structures as those of the emitter electrodes 120 and 220, the anode electrodes 151 and 251 and the modified examples of these may be applied to the collector electrode 140 and the cathode electrode 156. In the power semiconductor modules 10 according to the first and second embodiments described above, the emitter electrodes 120 and 220 of the semiconductor devices 100 and 200 which are IGBTs, and the anode electrodes 151 and 251 of the semiconductor devices 150 and 250 which are diodes have multilayer structures similar to each other (that is, the layers are formed of the same materials). However, the present invention is not limited to this. For example, a power semiconductor module 10 may be formed by combining the semiconductor device 100 in the first embodiment and the semiconductor device 250 in the second embodiment; a power semiconductor module 10 may be formed by combining the semiconductor device 200 in the second embodiment and the semiconductor device 150 in the first embodiment; and a plurality of semiconductor devices provided in the power semiconductor module 10 may use electrode materials different from each other.

The features and advantages of the present invention may be summarized as follows.

In the semiconductor device according to the first aspect, the occurrence of cracking in the first electrode layer when a thermal stress occurs can be reduced by laying on the first electrode layer the second electrode layer formed of a material lower in mechanical strength, thereby inhibiting transmission of cracking into the semiconductor layer through the first electrode layer.

In the semiconductor device according to the second aspect, the occurrence of cracking in the first electrode layer when a thermal stress occurs can be reduced by providing on the semiconductor layer the second electrode layer formed of a material lower in mechanical strength, thereby inhibiting transmission of cracking into the semiconductor layer through the first electrode layer.

Obviously many modifications and variations of the embodiments are possible in the light of the above teachings. It is therefore to be understood that within the scope of the appended claims the invention may be practiced otherwise than as specifically described. The entire disclosure of Japanese Patent Application No. 2015-125832, filed on Jun. 23, 2015 including specification, claims, drawings and summary, on which the Convention priority of the present application is based, is incorporated herein by reference in its entirety.

What is claimed is:

1. A semiconductor device comprising:
a collector, cathode, or drain electrode formed on a back surface of a semiconductor chip;
a semiconductor layer including an n-type drift layer and at least one n-type source layer formed on a front surface of the semiconductor chip; and
a first electrode, formed on the front surface of the semiconductor chip, the first electrode including:
a first electrode layer provided on the front surface of the semiconductor chip and formed of a first electroconductive material including AlSi in which the proportion of Si is higher than 1%;
a second electrode layer laid on the first electrode layer and formed of a second electroconductive material including Al, a proportion of Si in the second electrode layer being less than the proportion of Si in the first electroconductive layer, and the second electrode layer having a linear expansion coefficient different from that of the first electroconductive material and being lower in mechanical strength than the first electroconductive material; and
a third electrode layer laid directly on the second electrode layer and formed of a third electroconductive material having a linear expansion coefficient different from that of the first electroconductive material and having solder wettability higher than that of the first electroconductive material, wherein
a guard ring is provided in the front surface of the semiconductor layer, the guard ring surrounding the first electrode layer as seen in a plan view, and
the second electrode layer is provided by being extended outward relative to the third electrode layer so that a peripheral edge of the second electrode layer surrounds a peripheral edge of the third electrode layer as seen in the plan view.

2. The semiconductor device according to claim 1, further comprising a barrier metal layer provided between the first electrode layer and the second electrode layer and formed of an electroconductive material higher in mechanical strength than the second electroconductive material.

3. The semiconductor device according to claim 2, wherein the electroconductive material of the barrier metal layer is Ti or a Ti alloy.

4. The semiconductor device according to claim 1, wherein the first electroconductive material is AlSi and the second electroconductive material is pure aluminum.

5. The semiconductor device according to claim 4, wherein the first electroconductive material is AlSi in which the proportion of Si is higher than 1%.

6. The semiconductor device according to claim 1, wherein the first electroconductive material is AlSiCu in which the proportion of Si is higher than 1%, and which contains Cu.

7. The semiconductor device according to claim 1, further comprising:
   a solder layer laid on the third electrode layer; and
   a lead frame soldered to the third electrode layer by means of the solder layer.

8. The semiconductor device according to claim 1, wherein the material of the semiconductor layer is a wide-bandgap semiconductor.

9. The semiconductor device according to claim 1, further comprising a channel stopper provided outside the guard ring.

10. A semiconductor device comprising:
    a collector, cathode, or drain electrode formed on a back surface of a semiconductor chip;
    a semiconductor layer including an n-type drift layer and at least one n-type source layer formed on a front surface of the semiconductor chip; and
    a first electrode, formed on the front surface of the semiconductor chip, the first electrode including:
        a first electrode layer provided on the front surface of the semiconductor chip and formed of either AlCu in which the proportion of Cu is higher than 1% or AlSiCu in which the proportion of Si is higher than 1%; and
        a second electrode layer laid on the first electrode layer and formed of Cu, wherein
    a guard ring is provided in the front surface of the semiconductor layer, the guard ring surrounding the first electrode layer as seen in a plan view, and
    the first electrode layer is provided by being extended outward relative to a peripheral edge of the second electrode layer as seen in the plan view.

11. The semiconductor device according to claim 10, wherein the material of the first electrode layer is AlCu in which the proportion of Cu is higher than 1%.

12. The semiconductor device according to claim 10, wherein the material of the first electrode layer is AlSiCu in which the proportion of Si is higher than 1%.

13. The semiconductor device according to claim 10, further comprising a barrier metal layer provided between the first electrode layer and the second electrode layer and formed of a material higher in mechanical strength than the second electroconductive material.

14. The semiconductor device according to claim 13, wherein the material of the barrier metal layer is Ti or a Ti alloy.

15. The semiconductor device according to claim 10, further comprising:
    a solder layer laid on the second electrode layer; and
    a lead frame soldered to the second electrode layer by means of the solder layer.

16. The semiconductor device according to claim 10, wherein the material of the semiconductor layer is a wide-bandgap semiconductor.

17. The semiconductor device according to claim 10, further comprising a channel stopper provided outside the guard ring.

* * * * *